United States Patent
Mauder et al.

(10) Patent No.: US 10,991,832 B2
(45) Date of Patent: Apr. 27, 2021

(54) POWER DIODE

(71) Applicant: Infineon Technologies Austria AG, Villach (AT)

(72) Inventors: Anton Mauder, Kolbermoor (DE); Mario Barusic, Seebogen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/135,898

(22) Filed: Sep. 19, 2018

(65) Prior Publication Data

US 2019/0088799 A1   Mar. 21, 2019

(30) Foreign Application Priority Data

Sep. 21, 2017 (DE) .......................... 102017121878.5

(51) Int. Cl.
| | |
|---|---|
| H01L 29/861 | (2006.01) |
| H01L 29/06 | (2006.01) |
| H01L 29/66 | (2006.01) |
| H01L 21/265 | (2006.01) |
| H01L 29/417 | (2006.01) |
| H01L 29/36 | (2006.01) |

(52) U.S. Cl.
CPC .......... *H01L 29/861* (2013.01); *H01L 21/265* (2013.01); *H01L 21/26513* (2013.01); *H01L 29/0607* (2013.01); *H01L 29/36* (2013.01); *H01L 29/417* (2013.01); *H01L 29/66136* (2013.01)

(58) Field of Classification Search
CPC ... H01L 29/861; H01L 29/0607; H01L 29/36; H01L 29/417; H01L 29/66136; H01L 21/265; H01L 21/26513
See application file for complete search history.

(56) References Cited

U.S. PATENT DOCUMENTS

| | | | |
|---|---|---|---|
| 6,888,211 B2 | 5/2005 | Mauder et al. | |
| 9,443,971 B2 | 9/2016 | Haertl et al. | |
| 9,685,504 B2 | 6/2017 | Haertl et al. | |
| 2017/0271528 A1* | 9/2017 | Oota | H01L 27/0814 |
| 2018/0277686 A1* | 9/2018 | Dudek | H01L 29/861 |
| 2018/0374948 A1* | 12/2018 | Naito | H01L 29/739 |

FOREIGN PATENT DOCUMENTS

| | | |
|---|---|---|
| DE | 10261424 B3 | 7/2004 |
| EP | 3196943 A1 | 7/2017 |

* cited by examiner

*Primary Examiner* — Christine A Enad
(74) *Attorney, Agent, or Firm* — Murphy, Bilak & Homiller, PLLC

(57) ABSTRACT

A power diode includes a semiconductor body coupled to an anode metallization and to a cathode metallization. The semiconductor body has a drift region of a first conductivity type and an anode region of a second conductivity type. The anode region includes: a contact zone arranged in contact with the anode metallization; a field stop zone arranged below the contact zone; and a body zone arranged below the field stop zone and above the drift region. An electrically activated dopant concentration of the anode region has a profile, along a vertical direction, according to which: a first maximum is present within the contact zone; a second maximum is present within the field stop zone; and the dopant concentration continuously decreases from the first maximum to a local minimum, and continuously increases from the local minimum to the second maximum.

19 Claims, 5 Drawing Sheets

POWER DIODE

TECHNICAL FIELD

This specification refers to embodiments of a power diode and to embodiments of a method of processing a power diode. In particular, this specification is directed to embodiments of a power diode with a specific semiconductor anode structure and to corresponding processing methods.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and power diodes, to name a few, have been used for various applications including, but not limited to switches in power supplies and power converters.

A power diode usually comprises a semiconductor body configured to conduct a load current along a load current path between two load terminals of the diode, if a voltage in a forward direction is applied between said terminals. If a voltage in a backward direction is applied, the power diode usually assumes a blocking state and flow of a load current is inhibited.

The load terminals of a power diode are usually referred to as anode terminal and cathode terminal, and a transition from a conducting state to a blocking state of the power diode may follow a reverse recovery behavior of the power diode.

In certain applications, it may be desirable that a too high charge carrier concentration in proximity to the anode terminal is avoided such that high current peaks during the reverse recovery may be avoided.

SUMMARY

According to an embodiment, a power diode comprises a semiconductor body coupled to an anode metallization and to a cathode metallization of the power diode. The semiconductor body has a drift region of a first conductivity type and an anode region of a second conductivity type. The anode region comprises: a contact zone arranged in contact with the anode metallization; a field stop zone arranged below the contact zone; a body zone arranged below the field stop zone and above the drift region. An electrically activated dopant concentration of the anode region has a profile, along a vertical direction, according to which: a first maximum is present within the contact zone; a second maximum is present within the field stop zone; and the dopant concentration continuously decreases from the first maximum to a local minimum, and continuously increases from the local minimum to the second maximum.

According to another embodiment, a method of processing a power diode, comprises: providing a semiconductor body having a drift region of a first conductivity type; creating, in the semiconductor body, an anode region of a second conductivity type; providing an electrically activated dopant concentration in the anode region that has a profile, along a vertical direction, according to which: a first maximum is present within a contact zone of the anode region; a second maximum is present within the field stop zone of the anode region; and the dopant concentration continuously decreases from the first maximum to a local minimum, and continuously increases from the local minimum to the second maximum.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
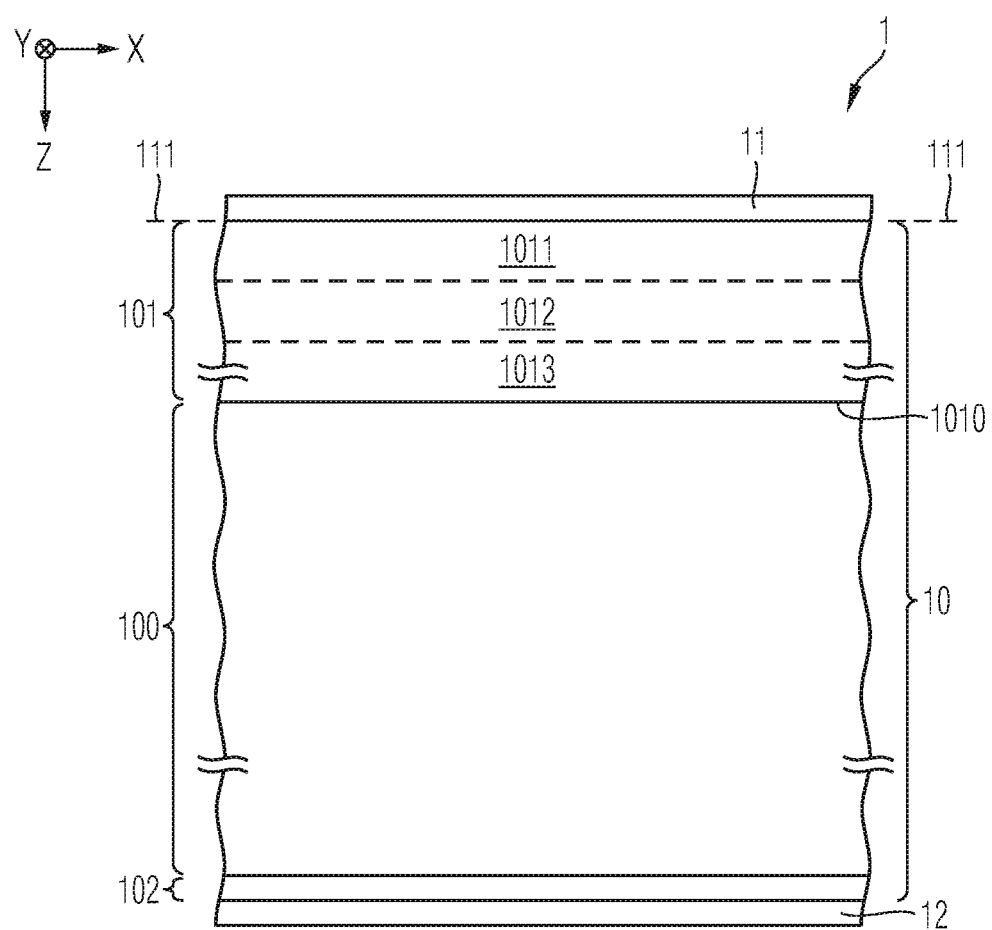
FIG. 1 schematically and exemplarily illustrates a section of a vertical cross-section of a power diode in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cells and/or such transistor cells may be integrated in a power semiconductor module. A plurality of such cells may constitute a cell field that is arranged with an active region of the power semiconductor device.

The present specification further relates to a power semiconductor device in the form of a power diode.

The term "power diode" as used in this specification intends to describe a semiconductor device on a single chip with high voltage blocking and/or high current-carrying capabilities. In other words, such power diode is intended for high current, typically in the Ampere range, e.g., up to several ten or hundred Ampere, and/or high voltages, typically above 15 V, more typically 100 V and above, e.g., up to at least 500 V.

For example, the power diode described below may be a semiconductor device configured to be employed as a power component in a low-, medium- and/or high voltage application. For example, the term "power diode" as used in this specification is not directed to logic semiconductor devices that are used for, e.g., storing data, computing data and/or other types of semiconductor-based data processing.

Figure 2:
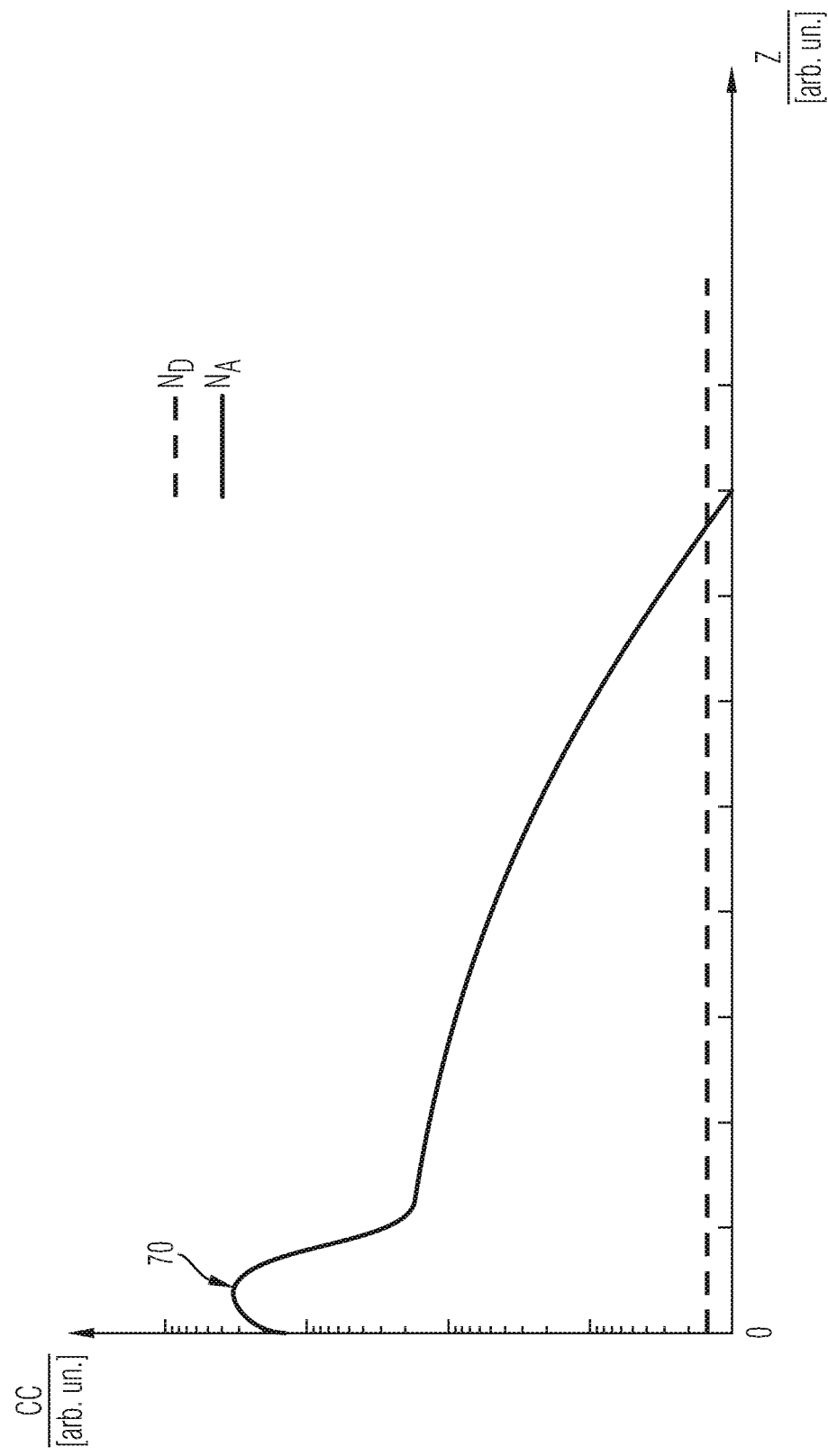
FIG. 2 schematically and exemplarily illustrates a course of charge carrier concentrations present in a semiconductor body of a power diode.

As it is known, a power diode may comprise a semiconductor body in which an anode region and the drift region are provided. Usually, the anode region is coupled to a first load terminal, e.g., an anode port, and the drift region is coupled to a second load terminal, e.g., a cathode port of the power diode. Often, the drift region is of the first conductivity type, and the anode region is of the second conductivity type. The drift region is typically configured in accordance with a designated blocking voltage of the power diode. The anode region shall, on the one side, provide for a good ohmic contact to the first load terminal, and, on the other side, for an appropriate emitter efficiency. In this respect, FIG. 2 exemplarily illustrates courses of dopant concentrations that may be present in a power diode, wherein the dashed line indicates the concentration of dopants of the first conductivity type and the continuous line indicates the concentration of dopants of the second conductivity type. For example, to provide for good contact, the anode region may have concentration of dopants of the second conductivity type that has a peak 70 in proximity to the first load terminal, wherein the first load terminal may interface with the anode region at position Z=0. After the peak 70, the dopant concentration rapidly decreases. For example, such peak 70 may be provided by a subjecting the semiconductor body to an implantation. In a major part of the anode region, the dopant concentration remains substantially below the value at the peak 70. Further along the vertical direction Z, the anode region interfaces with the drift region, thereby forming pn-junction, e.g., approximately at the position where the dashed line intersects with the continuous line in FIG. 2.

The course of the dopant concentration in the anode region in proximity to the load terminal has significant influence on the character of the power diode, e.g., regarding static and/or dynamic blocking capability, on-state losses, and emitter efficiency of the anode region and, hence, the dynamic behavior of the power diode, e.g., its reverse recovery behavior.

FIG. 1 schematically and exemplarily illustrates a section of a vertical cross-section of a power diode 1 in accordance with one or more embodiments.

The power diode 1 comprises a semiconductor body 10 coupled to an anode metallization 11 and to a cathode metallization 12 of the power diode 1. The anode metallization 11 can be part of the first load terminal, and the cathode metallization 12 can be part of a second load terminal of the power diode 1. The power diode 1 may exhibit a vertical configuration, according to which the anode metallization 11 is arranged at a front side of the power diode 1 and according to which the cathode metallization 12 is arranged at a backside of the power diode 1.

During an on-state, the power diode 1 can be configured to conduct a load current, e.g., along the vertical direction Z, between the anode metallization 11 and the cathode metallization 12. The on-state may be achieved by applying a voltage between the anode metallization 11 and the cathode metallization 12 with the electrical potential present at the anode metallization 11 being greater than the electrical potential present at the cathode metallization 12. During an off-state/blocking state, the power diode 1 can be configured to block a blocking voltage applied between the anode metallization 11 and the cathode metallization 12, the electrical potential present at the cathode metallization 12 being greater than the electrical potential present at the anode metallization 11.

The power diode 1 can be configured for a load current of at least 1 A, at least 5 A or for even more than 10 A.

The semiconductor body 10 has a drift region 100 of the first conductivity type and an anode region 101 of the second conductivity type. The drift region 100, e.g., its total extension along the vertical direction Z and/or its dopant concentration, can be configured for a blocking voltage of at least 300 V, of at least 500 V, or for a blocking voltage of even more than 700 V.

In an embodiment, the total extension of the anode region 101 in the vertical direction Z is within the range of 500 nm to 15000 nm, within the range of 1000 nm to 10000 nm, or within the range of 3000 nm to 6000 nm.

Further, the total extension of the drift region 100 in the vertical direction Z (e.g., the distance between pn-junction 1010 and the cathode metallization 12 along the vertical direction Z) may be within the range of 10 μm to 1000 μm, within the range of 30 μm to 500 μm, or within the range of 50 μm to 200 μm.

The power diode 1 can be implemented in a wafer having a thickness, in the vertical direction Z, within the range of 10 μm to 1000 μm, within the range of 30 μm to 750 μm, or within the range of 50 μm to 650 μm.

In an embodiment, the total extension of the anode region 101 in the vertical direction Z amounts to no more than 20% or to no more than 10% of the total extension of the drift region 100 (that may include the cathode region 102, cf. next paragraphs) in the vertical direction Z.

The drift region 100 may comprise dopants of the first conductivity type. For example, the drift region 100 is n-doped. The drift region 100 may exhibit a dopant concentration of dopants of the first conductivity type within the range of $10^{12}$ cm$^{-3}$ to $5*10^{14}$ cm$^{-3}$. For example, as indicated above, the dopant concentration of the drift region 100 and its total extension along the vertical direction Z are chosen in dependence on the voltage rating (e.g., the maximum blocking voltage) for which the power diode 1 shall be designed.

For example, the semiconductor body 10 further comprises a cathode region 102, wherein the drift region 100 can be coupled to the cathode metallization 12 by means of the cathode region 102. For example, the cathode region 102 is arranged in contact with the cathode metallization 12 and may exhibit a dopant concentration of dopants of the first conductivity type within the range of $5*10^{19}$ cm$^{-3}$ to $5*10^{20}$ cm$^{-3}$. In an embodiment, the cathode region 102 may function as a field stop region of the first conductivity type. The cathode region 102 can also be understood as forming a lower part of the drift region 100 and that has a dopant concentration significantly greater than the remaining part of the drift region 100. Hence, in an embodiment, the dopant concentration of the drift region 100 may vary along the vertical direction Z. Within its lower part that may form up to 20% of the total extension of the drift region 100 in the vertical direction Z, the maximum concentration of dopants of the first conductivity type may exceed by at least 10 times the concentration of dopants of the first conductivity type in at least a part of the remaining area of the drift region 100. Again, it shall be understood that said lower part of the drift region 100 may be formed by means of the cathode region 102.

The anode region 101 may comprise dopants of the second conductivity type. For example, the anode region 101 is p-doped.

In an embodiment, the power diode 1 may hence exhibit a PIN or a PN$^-$N structure that is formed by the anode region 101 (p-doped), the drift region 100 (I (intrinsic) or n$^-$-doped) and the cathode region 102 (n-doped).

The anode region 101 may comprise: a contact zone 1011 arranged in contact with the anode metallization 11; a field stop zone 1012 arranged below the contact zone 1011; and a body zone 1013 arranged below the field stop zone 1012 and above the drift region 100. According to the aforesaid, the term "below" indicates that field stop zone 1012 is arranged at a deeper level, with respect to the vertical direction Z, as compared to the contact zone 1011. Further, the body zone 1013 is arranged at a deeper level, with respect to the vertical direction Z, as compared to the field stop zone 1012.

For example, the field stop zone 1012 is sandwiched in between the contact zone 1011 and the body zone 1013. The contact zone 1011 may form the upper termination of the semiconductor body 10 and, e.g., exhibit a surface 111. Said surface 111 may interface with the anode metallization 11, e.g., either directly or with a diffusion barrier section (not separately illustrated) thereof. The body zone 1013 may interface with the drift region 100, wherein a transition between the body zone 1013 and the drift region 100 may form a pn-junction (cf. reference numeral 1010 in FIGS. 1, 3 and 4).

As will be explained in more detail below, the anode region 101 can be provided by creating a larger p-well within the semiconductor body 10, e.g., by carrying out a diffusion processing step. For example, such p-well may form the body zone 1013. Thereafter, the first implantation processing step can be carried out to form the field stop zone 1012, and a second implantation processing step can be carried out to form the contact zone 1011. Said implantations can be followed by a temperature annealing processing step, so as to provide for electrically activated dopant concentrations also within the contact zone 1011 and the field stop zone 1012.

In an embodiment, the total extension of the contact zone 1011 in the vertical direction Z is within the range of 10 nm to 700 nm, within the range of 30 nm to 500 nm, or within the range of 50 nm to 400 nm.

Further, the total extension of the field stop zone 1012 in the vertical direction Z may be within the range of 50 nm to 2000 nm, within the range of 100 nm to 1500 nm, or within the range of 300 nm to 1000 nm.

Further, the total extension of the body zone 1013 in the vertical direction Z may be within the range of 300 nm to 15000 nm, within the range of 500 nm to 10000 nm, or within the range of 1000 nm to 5000 nm.

Figure 3:
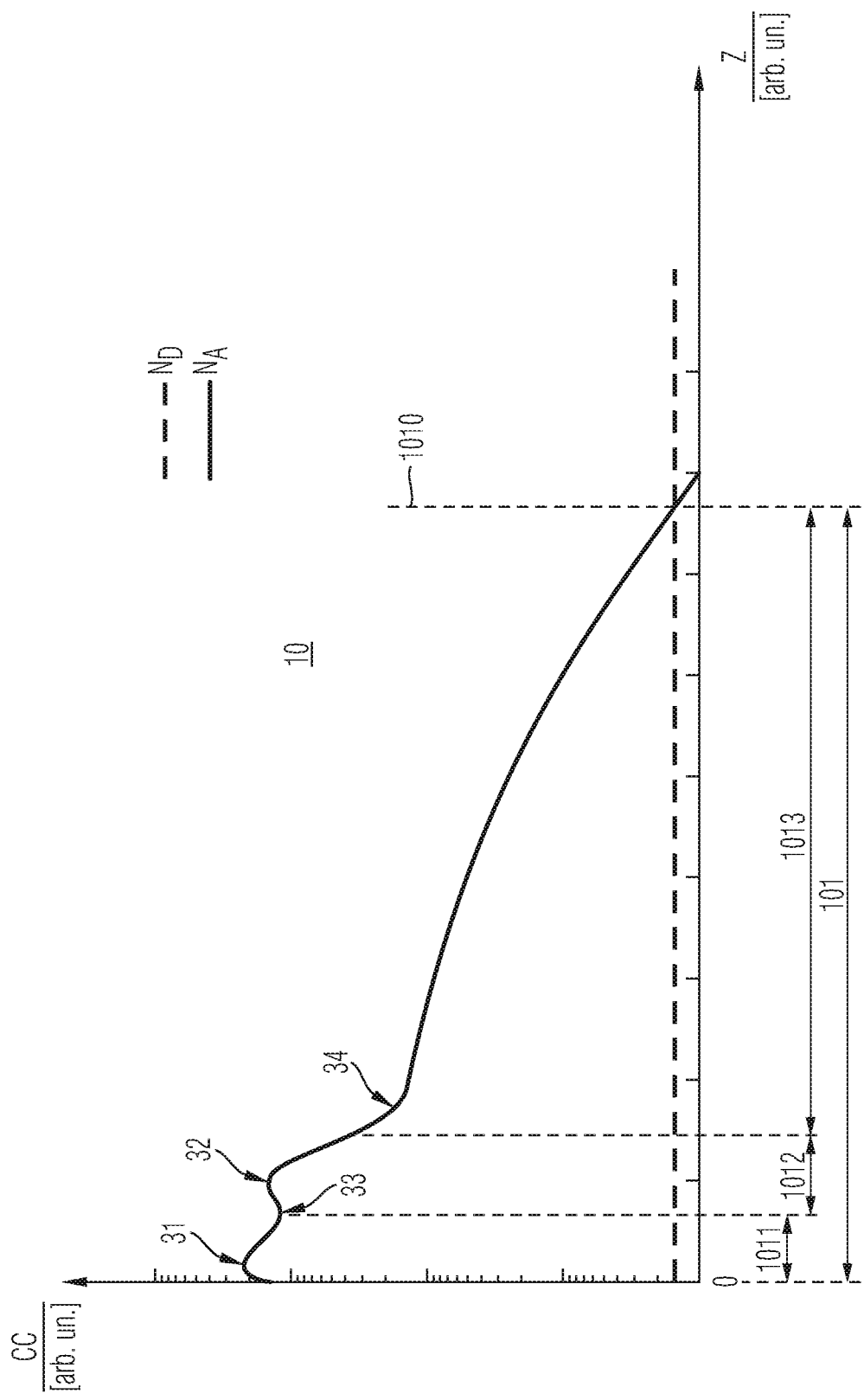
FIG. 3 schematically and exemplarily illustrates a course of charge carrier concentrations present in a semiconductor body of a power diode in accordance with one or more embodiments.

Now additionally referring to FIG. 3, which exemplarily and schematically illustrates courses of the dopant concentration (concentration $N_A$ (p-type dopants) and concentration $N_D$ (n-type dopants)) present within the semiconductor body 10 of the power diode 1 of FIG. 1, in an embodiment, an electrically activated dopant concentration of the anode region 101 has a profile, along the vertical direction Z, according to which:

(i) a first maximum 31 is present within the contact zone 1011;
(ii) a second maximum 32 is present within the field stop zone 1012; and
(iii) the dopant concentration continuously decreases from the first maximum 31 to a local minimum 33, and continuously increases from the local minimum 33 to the second maximum 32.

In an embodiment, the transition between the contact zone 1011 and the field stop zone 1012 occurs at said local minimum 33.

Within in the present specification, the term "electrically activated the dopant concentration" refers to a dopant concentration that provides and/or increases the electric conductivity. For example, the term "electrically activated the dopant concentration" does not refer to a damage concentration. In an embodiment, neither the contact zone 1011 nor the field stop zone 1012 is damaged, or, respectively, comprises a damage zone (wherein, of course, it is almost impossible to avoid minimal crystal defects, e.g., vacancies, in particular in close proximity to the surface 111). Rather, in an embodiment, at least within the contact zone 1011 and the field stop zone 1012, an electric conductivity, e.g., the sheet electric conductivity, is substantially proportional to the electrically activated dopant concentration. A proportionality factor can be defined as temperature dependent carrier mobility. The carrier mobility is influenced by the concentration of doping atoms (acceptors and donors) being present in a semiconductor region since doping atoms are leading to Coulomb scattering of mobile carriers, i.e., the higher the doping concentration, the lower the mobility of mobile carriers. The carrier mobility in a region providing no or only marginal crystal defects as stated above may be defined as bulk mobility depending on the concentration of donors and acceptors in the region. Thus, it shall be understood that, starting at the position of the first maximum 31 and proceeding along the vertical direction Z, e.g., until pn-junction 1010, in an embodiment, the charge carrier mobility and/or lifetime is not disturbed by a damage region or the like. For example, the carrier mobility in the region starting at the position of the first maximum 31 and proceeding along the vertical direction Z, e.g., until pn-junction 1010, in an embodiment, may differ by a maximum of 20% from the bulk mobility. For example, the first maximum 31 is the first maximum of the electrically activated dopant concentration that occurs along the vertical direction Z (starting at Z=0, i.e., at the surface 111) and the second maximum 32 is the second maximum of the electrically activated dopant concentration that occurs along the vertical direction Z. In between the first maximum 31 and the second maximum 32, the electrically activated dopant concentration does not drop below the local minimum 33. Rather, the dopant concentration continuously decreases form the first maximum 31 to the local minimum and continuously increases from the local minimum 33 to the second maximum 32. Further, in an embodiment, in between the second maximum 32 and an inflexion point 34 (elucidated in more detail below), the electrically activated dopant concentration does not drop below the value present at the inflexion point 34, but continuously decreases from the second maximum to the inflexion point.

In an embodiment, the anode region 101 has, along the vertical direction Z, five equal shares, wherein each of the first maximum 31 and the second maximum 32 are positioned within the uppermost equal share, i.e., within the upper 20% of the total extension of the anode region 101 along the vertical direction. For example, the each of the first maximum 31 and the second maximum 32 are positioned within a distance of 2000 nm from the anode metallization 11, measured from a transition between the contact zone 1011 and the anode metallization 11 along the vertical direction Z, e.g., measured from the surface 111 along the vertical direction Z. Said distance may be smaller than 2000 nm, e.g., smaller than 1000 nm or even smaller than 750 nm.

Further, the first maximum 31 may occur within a distance (along the vertical direction) of less than 300 nm, less than 200 nm or even less than 100 nm. According to an embodiment, first maximum 31 may occur in the contact zone 1011 at the transition between said contact zone 1011 and the anode metallization 11.

A distance along the vertical direction Z between the first maximum 31 and the second maximum may be within the range of 100 nm to 2000 nm, within the range of 200 nm to 1000 nm or within the range of 300 nm to 750 nm.

In an embodiment, the second maximum 32 is within the range of 70% to 130% of the first maximum 31. Thus, it shall be understood that the second maximum 32 can be larger than the first maximum 31. The second maximum 32 can hence be an absolute maximum of the dopant concentration of the anode region 101. The electrically activated dopant concentration at each of first maximum 31 and the second maximum 32 can be greater than $10^{17}$ cm$^{-3}$. The local minimum 33 can be within the range of 10% to 50% of the first maximum 31. Further, the maximum electrically activated dopant concentration within the body zone 1013, e.g., at each position of the body zone 1013 along the vertical direction Z, may be within the range of $\frac{1}{50}$ to $\frac{1}{5}$ of the electrically activated dopant concentration present at an arbitrary one of first maximum 31 and the second maximum 32. Of course, at positions closer to the field stop zone 1012, the electrically activated dopant concentration of the body zone 1013 may be greater as compared to the electrically activated dopant concentration at positions closer to the drift region 100.

Further along the vertical direction Z, according to the profile, the electrically activated dopant concentration may continuously decrease from the second maximum 32 to an inflexion point 34 at which the rate of change of the dopant concentration with respect to the vertical direction Z, in the following referred to as gradient, has a local maximum. The dopant concentration may thereafter continuously decrease from the inflexion point 34 throughout the body zone 1013 until said transition formed between the body zone 1013 and the drift region 100, namely said pn-junction 1010.

A first concentration gradient present above the inflexion point 34 can be greater than a second concentration gradient present below the inflexion point 34, as exemplarily illustrated in FIG. 3, e.g., by a factor of at least three. In an embodiment, the mean gradient of the dopant concentration along the vertical direction Z between the second maximum 32 and the inflexion point 34, i.e. the difference between the dopant concentrations at the second maximum 32 and the inflexion point 34 divided by the distance between the second maximum 32 and the inflexion point 34 along the vertical direction Z may be said first concentration gradient and, hence, be greater than the second concentration gradient present below the inflexion point 34. Said second concentration gradient can be the dopant concentration gradient along the vertical direction Z between the inflexion point 34 and the concentration of dopants of the second conductivity type being present at the pn-junction 1010, i.e. the difference between the dopant concentrations at the inflexion point 34 and the concentration of dopants of the second conductivity type being present at the pn-junction 1010 divided by the distance between the inflexion point 34 and the position of the pn-junction 1010 along the vertical direction Z. Said first gradient can be greater than said second gradient by a factor of at least 3, of at least 5 or of at least 10.

The electrically activated dopant concentration present at the inflexion point may be within the range of $10^{15}$ cm$^{-3}$ to $5·10^{16}$ cm$^{-3}$. According to an embodiment, the electrically activated dopant concentration present at the inflexion point 34 may be lower than the doping of the local minimum 33.

Figure 4:
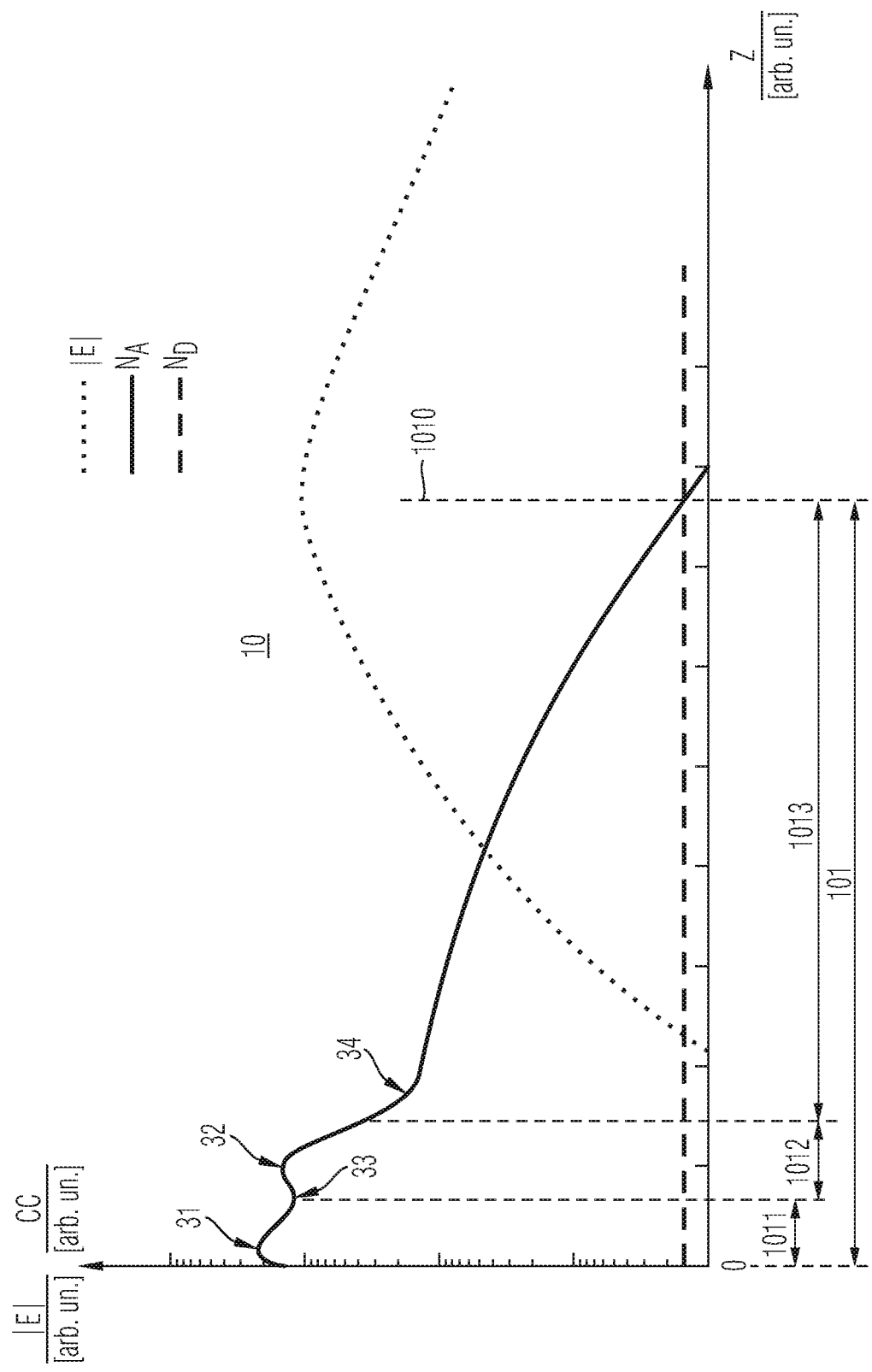
FIG. 4 schematically and exemplarily illustrates courses of an electric field and of charge carrier concentrations present in a semiconductor body of a power diode in accordance with one or more embodiments.

FIG. 4 corresponds to FIG. 3 and additionally illustrates an exemplary course of an electric field E (dotted line) during a static blocking state of the power diode 1. In an embodiment, the electrical field stops below the inflexion point 34.

Thus, the anode region 101 may be configured so as to ensure that the electric field, during the static blocking state, does not extend up to the second maximum 32 but stops well before (i.e., below) thereof, e.g., below the inflexion point 34. For example, a distance (along the vertical direction) between the second maximum 32 and a peak of the electric field during the blocking state of the power diode 1 amounts to at least 500 nm. For example, during forward conduction of the power diode 1, the drift region 100 is flooded with more mobile electrons and holes than the background doping concentration, thereby providing low on-state voltage of the power diode 1. At commutation of the power diode 1, i.e. when changing from the forward conducting state ("on-state") to the blocking state, excess charge has to be removed out of the drift region 100. The stored mobile holes are removed via the anode region 101 and anode metallization 11. Positive charge of the mobile holes during commutation may lead to a temporarily further penetration of the electric field in direction towards the anode metallization 11 (not shown in FIG. 4). The electric field may be stopped before reaching second maximum 32 or before reaching first maximum 31. Thereby, the risk of accidental breakthroughs can be reduced. Further, based on the proposed structure, according to which the two maxima 31 and 32 may function redundantly with respect to avoidance of field penetration towards the anode metallization 11, a production method can be designed more robust.

Figure 5:
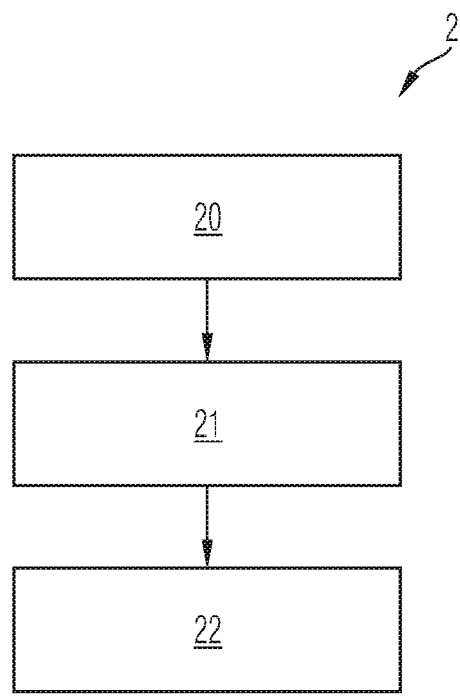
FIG. 5 schematically and exemplarily illustrates an aspect of a method of processing a power diode in accordance with one or more embodiments.

Proposed herein is also a method of processing a power diode, e.g., a method for manufacturing a power diode in accordance with one of the embodiments presented above. A flow diagram of an exemplary embodiment of a method 2 of processing a power diode is schematically illustrated in FIG. 5, to which it will now be referred.

In a first step 20, a semiconductor body is provided that has a drift region of the first conductivity type. Then, in step 21, an anode region of the second conductivity type is created in the semiconductor body. Subsequently, in step 22, an electrically activated dopant concentration in the anode region is provided with a profile, according to which: a first maximum is present within a contact zone of the anode region; a second maximum is present within the field stop zone of the anode region; and the dopant concentration continuously decreases from the first maximum to a local minimum, and continuously increases from the local minimum to the second maximum.

Features of exemplary embodiments of the power diode 1 that have been explained above with respect to FIG. 1 and FIGS. 3 and 4 may equally apply to exemplary embodiments of the method 2. Hence, it is refrained from repeating these optional features again. But, for clarity reasons, reference signs employed above for illustrating exemplary embodiments of the power diode 1 will now identically be used in order to explain exemplary embodiments of the method 2. However, it shall be understood that the method presented herein is not necessarily limited to providing embodiments of the power diode 1 that have been explained above with respect to FIG. 1 and FIGS. 3 and 4. Nevertheless, features of optional embodiments of the method 2 described below may equally apply to the embodiments of the power diode 1 described above.

For example, providing (cf. step 22) the electrically activated dopant concentration in the anode region 101 comprises carrying out a diffusion processing step so as to provide a base dopant concentration with the anode region 101, e.g. by using boron as the dopant material. This may include out an implantation step for introducing dopants of the second conductivity type into the semiconductor body 10 followed by a diffusion processing step. For example, thereby, a larger p-well may come into being that essentially has the dimensions of the anode region 101 and provides for an electrically activated base dopant concentration that has the course as illustrated in FIGS. 3 and 4 with respect to the body zone 1013. Before creating the field stop zone 1012 and the contact zone 1011, the course of the base dopant concentration would continuously extend against the vertical direction Z in accordance with the course present in the body zone 1013.

Further, providing (cf. step 22) the electrically activated dopant concentration in the anode region 101 may comprise carrying out a first implantation processing step with a first implantation energy for producing the second maximum 32, and, carrying out a second implantation processing step with a second implantation energy for producing the first maximum 31. As has been explained above, the second maximum 32 can be greater than the first maximum 31.

For example, the second implantation processing step is carried with an implantation energy of less than 30 keV or less than 20 keV. For example, the second implantation processing step is carried such that the mean distance of the implanted ions, measured from the surface 111 of the provided semiconductor body 10 that has been penetrated by the implanted ions, amounts to less than 100 nm. This mean distance can be even shorter, e.g., shorter than 80 nm, shorter than 70 nm or even shorter than 50 nm. A possible measure to adjust the mean distance is not only the implantation energy applied during the second implantation processing step, but also a thickness of a thin layer, e.g. an oxide layer, (not illustrated) at the surface 111 that may come into being during preparation of the single ion implantation processing step.

For example, the second implantation processing step is carried with an implantation energy smaller than the implantation energy applied during the first implantation. The implantation doses for each of the first implantation and the second implantation can be, e.g. substantially identical to each other, for example, the doses may each amount to $4*10^{12}$ cm$^{-2}$. In another embodiment, the implantation dose applied during the first implantation can be greater as compared to the dose applied during the second implantation, e.g., so as to provide the second maximum 32 with a value greater than the value of the first maximum 31. However, it shall be understood that the second maximum 32 can, in another embodiment, also be provided with a value smaller than the value of the first maximum 31.

During each of the first and the second implantation, boron can be implanted.

Providing (cf. step 22) the electrically activated dopant concentration in the anode region 101 can further comprise carrying out a high temperature annealing processing step so as to substantially entirely heal defects caused by the first implantation processing step, or, respectively, by the first and second implantation processing steps, thereby providing the electrically activated dopant concentration within the contact zone 1011 and the field stop zone 1012. According to an embodiment, the high temperature annealing processing step may comprise heating up the semiconductor body 10 to temperatures of at least 800° C., 900° C. or 1000° C. for at least a second, a minute or several minutes.

As has been explained above, in an embodiment, none of the contact zone 1011 and the field stop zone 1012 are damaged. For example, a damage implantation can be carried out by implanting particles into the semiconductor body and subsequently refraining from carrying out a high temperature annealing processing step or, respectively, subsequently carrying out only short and/or low temperature annealing processing step according to which the defects caused by the implantation are not entirely healed. In accordance with the exemplary embodiment of the method 2, the temperature annealing processing step is carried out so as to substantially entirely heal the defects caused by the implantation(s).

In an embodiment, at least one of the first implantation processing step and the second implantation processing step is carried out by using an energy filter. The use of energy filters for obtaining certain dopant concentration profiles is as such known to the skilled person.

Hence, the profile of the electrically activated dopant concentration within the body zone 1013 can be diffusion profile, and the profile of the electrically activated dopant concentration within each of the contact zone 1011 and the field stop zone 1012 can be an implantation profile. The dose for each of the contact zone 1011 and the field stop zone 1012 can be smaller than $2*10^{13}$ cm$^{-2}$, can be smaller than $1*10^{13}$ cm$^{-2}$ or can be smaller than $5*10^{12}$ cm$^{-2}$, and the dose for body zone 1013 can be smaller than $1*10^{13}$ cm$^{-2}$, can be smaller than $6*10^{12}$ cm$^{-2}$ or can be smaller than $3*10^{12}$ cm$^{-2}$.

In another embodiment, creating the profile of the electrically activated dopant concentration within at least one of the contact zone 1011 and the field stop zone 1012 may involve carrying out an epitaxy processing step.

In the above, embodiments pertaining to power diodes and corresponding processing methods were explained. For example, these power diodes are based on silicon (Si). Accordingly, a monocrystalline semiconductor region or layer, e.g., the semiconductor body 10 and its regions/zones, e.g., regions 100, 101, 102 etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a power diode. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (In-GaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power diode, comprising a semiconductor body coupled to an anode metallization and to a cathode metallization, wherein the semiconductor body has a drift region of a first conductivity type and an anode region of a second conductivity type, the anode region comprising:
 a contact zone arranged in contact with the anode metallization;
 a field stop zone arranged below the contact zone; and
 a body zone arranged below the field stop zone and above the drift region;
 wherein an electrically activated dopant concentration of the anode region has a profile, along a vertical direction, according to which:
 a first maximum is present within the contact zone;
 a second maximum is present within the field stop zone;
 the dopant concentration continuously decreases from the first maximum to a local minimum, and continuously increases from the local minimum to the second maximum; and
 the second maximum is within a range of 70% to 130% of the first maximum, wherein, according to the profile, the dopant concentration continuously decreases from the second maximum to an inflexion point at which a rate of change of the dopant concentration with respect to the vertical direction has a local maximum, and wherein during a blocking state of the power diode, the electrical field stops below the inflexion point.

2. The power diode of claim 1, wherein the second maximum is an absolute maximum of the dopant concentration of the anode region.

3. The power diode of claim 1, wherein the local minimum is within a range of 10% to 50% of the first maximum.

4. The power diode of claim 1, wherein the electrically activated dopant concentration at each of the first maximum and the second maximum is greater than $10^{17}$ cm$^{-3}$.

5. The power diode of claim 1, wherein the maximum electrically activated dopant concentration within the body zone is within a range of 1/50 to 1/5 of the electrically activated dopant concentration at the first maximum and the second maximum.

6. The power diode of claim 1, wherein, at least within the contact zone and the field stop zone, an electric conductivity is substantially proportional to the electrically activated dopant concentration.

7. The power diode of claim 1, wherein, according to the profile, the dopant concentration continuously decreases from the inflexion point throughout the body zone until a transition formed between the body zone and the drift region.

8. The power diode of claim 7, wherein a first concentration gradient present above the inflexion point is greater than a second concentration gradient present below the inflexion point by a factor of at least three.

9. The power diode of claim 1, wherein the anode region has, along the vertical direction, five equal shares, wherein each of the first maximum and the second maximum are positioned within an uppermost one of the equal shares.

10. The power diode of claim 1, wherein each of the first maximum and the second maximum are positioned within a distance of 2000 nm from the anode metallization, measured from a transition between the contact zone and the anode metallization along the vertical direction.

11. The power diode of claim 1, wherein:
a total extension of the anode region in the vertical direction amounts to no more than 20% of a total extension of the drift region in the vertical direction;
the total extension of the anode region in the vertical direction is within a range of 500 nm to 15000 nm;
the total extension of the drift region in the vertical direction is within a range of 10 µm to 1000 µm; and/or
the power diode is formed in a wafer having a thickness, in the vertical direction, within a range of 10 µm to 1000 µm.

12. The power diode of claim 1, wherein the profile within each of the contact zone and the field stop zone is an implantation profile.

13. The power diode of claim 1, wherein a dose for each of the contact zone and the field stop zone is smaller than $2*10^{13}$ cm$^{-2}$.

14. The power diode of claim 1, wherein a dose for body zone is smaller than $1*10^{13}$ cm$^{-2}$.

15. The power diode of claim 1, wherein the profile within the body zone is a diffusion profile.

16. The power diode of claim 1, wherein a distance between the second maximum and a peak of an electric field during a blocking state of the power diode is at least 500 nm.

17. The power diode of claim 1, wherein the drift region is configured for a blocking voltage of at least 500 V.

18. The power diode of claim 1, wherein the semiconductor body further comprises a cathode region of the first conductivity type, and wherein the drift region is coupled to the cathode metallization through the cathode region.

19. A power diode, comprising a semiconductor body coupled to an anode metallization and to a cathode metallization, wherein the semiconductor body has a drift region of a first conductivity type and an anode region of a second conductivity type, the anode region comprising:
a contact zone arranged in contact with the anode metallization;
a field stop zone arranged below the contact zone; and
a body zone arranged below the field stop zone and above the drift region;
wherein an electrically activated dopant concentration of the anode region has a profile, along a vertical direction, according to which:
a first maximum is present within the contact zone;
a second maximum is present within the field stop zone;
the dopant concentration continuously decreases from the first maximum to a local minimum, and continuously increases from the local minimum to the second maximum; and
the second maximum is within a range of 70% to 130% of the first maximum, and
wherein the field stop zone is completely separated from the anode electrode by the contact zone.

* * * * *